US 6,552,277 B1

(12) United States Patent
Downes

(10) Patent No.: US 6,552,277 B1
(45) Date of Patent: Apr. 22, 2003

(54) TECHNIQUES FOR FORMING A CONNECTION BETWEEN A PIN AND A CIRCUIT BOARD

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 198 days.

(21) Appl. No.: 09/658,764

(22) Filed: Sep. 8, 2000

(51) Int. Cl.[7] ............................................... H01R 12/04
(52) U.S. Cl. ...................... 174/267; 174/262; 174/266; 361/803; 361/743; 439/65; 439/83
(58) Field of Search ................................. 174/267, 262, 174/265, 266, 261, 263, 250, 260; 361/803, 807, 719, 760, 743, 790; 439/65, 79, 83, 70, 69, 78, 82

(56) References Cited

U.S. PATENT DOCUMENTS

| 4,076,356 | A | * | 2/1978 | Tamburro ................... 439/426 |
| 4,968,263 | A | * | 11/1990 | Silbernagel et al. ........ 439/246 |
| 5,548,486 | A | * | 8/1996 | Kman et al. ................. 361/791 |
| 5,565,654 | A | * | 10/1996 | Zell et al. .................... 174/265 |
| 5,816,868 | A | * | 10/1998 | Legrady et al. ............. 439/876 |
| 6,049,039 | A | * | 4/2000 | Fushimi ..................... 174/68.1 |
| 6,179,631 | B1 | * | 1/2001 | Downes et al. ............... 439/83 |
| 6,217,346 | B1 | * | 4/2001 | Cubon ......................... 439/78 |
| 6,229,101 | B1 | * | 8/2001 | Sekiya et al. ............... 174/266 |

FOREIGN PATENT DOCUMENTS

JP      363285961   A   *  11/1988
JP      41007488    A   *  3/1998

* cited by examiner

Primary Examiner—Kamand Cureo
Assistant Examiner—I B Patel
(74) Attorney, Agent, or Firm—Chapin & Huang, L.L.C.; David E. Huang, Esq.

(57) ABSTRACT

The invention is directed to techniques for forming a connection between a pin and a circuit board using a pin having protruding portions and grooved surfaces that extend between the protruding portions. The protruding portions (i) prevent the pin from inadvertently slipping through a via of the circuit board, and (ii) maintains the pin's proper position relative to the circuit board via. The grooved surfaces enable gas to vent from a cavity in the via during the solder process thus enabling solder to flow within the via and form a reliable and robust solder joint between the pin and the circuit board via. In one arrangement, the protruding portions and grooved surfaces are at both ends of the pin enabling the pin to be soldered between two circuit board sections. In one arrangement, the pin is simultaneously soldered to both circuit board sections. In another arrangement, the pin is initially soldered to one circuit board section, and subsequently soldered to another circuit board section. In either arrangement, the protruding portions of the pin, and in some arrangements close tolerances between the pin and the via, facilitate positioning of the pin in its proper location and the additional surface area provided by the grooved surfaces and the protruding portions (i.e., wetted metallic surfaces having a high affinity for solder) retain solder in the via cavities of the circuit board sections in order to form healthy solder joints. Accordingly, the invention is suitable for use in connecting multiple circuit board sections together at opposite ends of a pin.

22 Claims, 6 Drawing Sheets

TECHNIQUES FOR FORMING A CONNECTION BETWEEN A PIN AND A CIRCUIT BOARD

BACKGROUND OF THE INVENTION

There are several conventional approaches to forming a connection between a circuit board component (e.g., a connector, an integrated circuit or IC, etc.) and a circuit board. One approach, which is called the compression-fit or press-fit approach, involves the mating of specialized compression-fit pins of the circuit board component with circuit board vias (i.e., metal plated-through holes in the circuit board). One type of compression-fit pin (referred to as an eye-of-the-needle press-fit pin) is a metallic shaft having a hole or channel cut through the shaft in order to separate at least a portion of the shaft into two approximately parallel extending members. The total cross-sectional diameter of the shaft (i.e., the two extending members and the hole) of this compression-fit pin is slightly larger than the cavity of its corresponding via. Accordingly, when the compression-fit pin inserts within the via, metal sides of the via compress (i.e., squeeze) the two extending members of the compression-fit pin shaft toward each other. The frictional forces between the via and the shaft hold the pin in place and provide suitable electrical contact for carrying electrical signals between the pin of the circuit board component and the via of the circuit board.

Another type of compression-fit pin (referred to as a turret press-fit pin) has V-shaped notches cut along the side of a segment of the pin. Here, the total cross-sectional diameter of the segment is slightly larger than the via cavity such that, when the compression-fit pin inserts within the via, the edges of the notched segment cut into the metallic sides of the via (with metallic debris collecting in the notches of the pin) in order to form suitable electrical contact.

Some compression-fit pins have extending detention portions that laterally extend from the pins to prevent the pins from inserting too deeply within the vias. That is, when the pins insert into the vias, the pins continue to pass into the via cavities until the detention portions contact the tops of the vias (and perhaps the circuit board surface depending on the size of the detention portions). At this point, the detention portions provide an interference fit against the via tops preventing the pins from inserting further into the via cavities in order to provide the proper insertion depth for the pins within the circuit board vias.

Another approach to forming a connection between a circuit board component and a circuit board is to form a solder joint between pins of the circuit board component and vias of the circuit board. In contrast to the compression-fit pin which has a hole or channel through the shaft in order to form two approximately parallel extending members, a typical soldering pin has a substantially symmetrical and uniform cross-section (e.g., a circular cross-section or a square cross-section) which is typically half the size of the inner diameter of the corresponding vias of the circuit board in order to enable solder to easily flow within the via cavities between the pins and the inner surfaces of the vias to form solder joints. For example, for a soldering pin having a diameter of 0.018 inches ("18 mils"), the diameter of the via cavity is typically 0.039 inches ("39 mils").

One soldering approach involves a process called wave-soldering. In this approach, pins of the component insert through vias of the circuit board such that the component rests in its intended mounting location. Then, the circuit board passes over a wave of melted solder, i.e., solder heated until it is in liquid form (e.g., 500 degrees Fahrenheit), such that solder from the wave adheres to the metallic surfaces of the vias and the pins, and fills the remaining spaces in the via cavities. The solder within the vias then cools and forms solder joints between the component pins and the circuit board vias.

In another approach called reflow soldering, preformed portions of solder (e.g., a fairly rigid disk shaped segment of solder and flux) attach to the pins which are inserted into their intended vias. When heat is applied, the portions of solder melt and draw into the cavities of the vias due to the solder's affinity for metallic flux-cleaned surfaces. The solder then cools to form solder joints between the pins and the circuit board vias.

In yet another approach called intrusive reflow soldering, portions of solder paste (a mixture of solder and flux) are initially placed in or adjacent to cavities of vias of a circuit board (e.g., using a stencil or syringe-like device). The pins of the component are then positioned over the intended circuit board mounting location (i.e., over the circuit board vias). Typically, an oven then applies heat such that the flux volatizes and de-oxidizes the adjacent metallic surfaces. Next, the solder melts and migrates to these metallic surfaces of the pins and the vias thus filling the via cavities with solder. The solder then cools and forms solder joints between the component pins and the circuit board vias.

SUMMARY OF THE INVENTION

In some applications it would be useful to connect two circuit board sections (i.e., a small section of circuit board material or a small portion of a larger circuit board) together using pins and a soldering process. That is, it would be useful to solder one end of a pin to a first circuit board section, and the other end of the pin to a second circuit board section in order to connect the first and second circuit board sections together.

Unfortunately, there would be deficiencies to using conventional pins and soldering techniques to solder the ends of a pin to the first and second circuit board sections in order to connect the two sections together. For example, suppose that a circuit board manufacturer tries to connect the first and second circuit board sections together by positioning the pins and the first and second circuit board sections in a sandwiched manner and then applying heat to solder the pins to the sections. That is, suppose that the manufacturer positions the first circuit board section horizontally, inserts solder paste and pins into vias of the first circuit board section, and lays solder paste and the second circuit board section over the pins. Then, suppose that the manufacturer applies heat to melt the solder paste. In such a situation, it is likely some pins will insert into the vias at improper depths since a typical soldering pin is half the diameter of a via cavity and since there is nothing to prevent the pins from slipping through the vias of the circuit board sections. Accordingly, some pins may slip away from the top-positioned second circuit board section, and solder may escape from some via cavities leaving an inadequate amount of solder to form solder joints.

Furthermore, suppose that the circuit board manufacturer solders pins to the first circuit board section, and subsequently attempts to solder the pins to the second circuit board section. Unfortunately, there is still a likelihood that the solder joints between the pins and the first circuit board section will reflow during the second soldering process causing pins and solder to move out of their proper locations. The likely end result is inadequate and poorly formed solder joints.

In contrast to the above-described conventional pins and soldering approaches, the invention is directed to techniques for forming a connection between a pin and a circuit board using a pin having protruding portions and grooved surfaces that extend between the protruding portions. The protruding portions prevent the pin from inadvertently slipping through a via of the circuit board, and maintain its proper position. The grooved surfaces enable gas to vent from a cavity in the via during the solder process. Such venting prevents gas pockets or bubbles from forming within the via cavity that could form cracks or intermittent electrical connections between the pin and the via. Accordingly, such gas venting enables solder to flow within the via and form a reliable and robust solder joint between the pin and the circuit board via.

In one arrangement, the protruding portions and grooved surfaces are at both ends of the pin enabling the pin to be properly soldered between two circuit board sections. In one arrangement, the pin is simultaneously soldered to both circuit board sections. In another arrangement, the pin is initially soldered to one circuit board section, and subsequently soldered to another circuit board section. In either arrangement, the protruding portions of the pin facilitate positioning of the pin in its proper location and the additional surface area provided by the grooved surfaces and the protruding portions (i.e., wetted metallic surfaces having a high affinity for solder) retain solder in the via cavities of the circuit board sections in order to form healthy solder joints. Accordingly, the invention is suitable for use in connecting multiple circuit board sections together at opposite ends of a pin.

One arrangement of the invention is directed to a method for forming a connection between a pin and a circuit board. The method includes the step of providing a pin having an elongated portion and protruding portions that extend from the elongate portion. The elongated portion has grooved surfaces that extend along the elongated portion in a parallel manner. Additionally, each grooved surface extends between a pair of the protruding portions. The method further includes the steps of inserting the pin into a via of a circuit board, and soldering the pin to the via of the circuit board. The protruding portions enable proper positioning of the pin relative to the via of the circuit board (e.g., the protruding portions create an interference fit between the pin and the top of the via thus preventing the pin from slipping through the via or too deeply into the via).

Furthermore, the protruding portions do not prevent gas within the via cavity from escaping due. Rather, the grooved surfaces extend between pairs of protruding portions thus providing openings for gas to easily escape. Accordingly, solder can easily displace the gasses within the via cavity to form a healthy solder joint between the pin and the circuit board via. Such openings also provide ideal visual inspection points for an inspector to visually confirm adequate transfer of solder to the via cavity.

In one arrangement, the elongated portion of the pin has a circular cross-section. Here, the step of providing the pin includes the step of forming a member having a post, a first disk that radially extends from a first region of the post, and a second disk that radially extends from a second region of the post. The step of providing the pin further includes the steps of (i) cutting a first set of grooves through the first disk to a first end of the post to form a first set of the protruding portions that extend from the first region of the post, and (ii) cutting a second set of grooves through the second disk to a second end of the post to form a second set of the protruding portions that extend from the second region of the post. Accordingly, the first set of protruding portions can be used to properly position the pin relative to a first circuit board section, and the second set of protruding portions can be used to properly position the pin relative to a second circuit board section.

In one arrangement, the step of soldering includes the steps of (i) providing a solder preform around a region of the pin prior to the step of inserting the pin into the via, and (ii) applying heat to form a solder joint between the via and the pin in accordance with a reflow soldering process. That is, the solder preform around the pin melts thus contributing solder to the solder joint. As a result, the invention is suitable for use with a reflow soldering process.

In another arrangement, the step of soldering includes the steps of (i) providing a portion of solder paste to the via of the circuit board prior to the step of inserting the pin into the via (e.g., using a stencil, a syringe-like device, etc.), and (ii) applying heat to form a solder joint between the via and the pin in accordance with an intrusive reflow soldering process. Here, flux within the solder paste activates and volatizes during the soldering process, and solder from the solder paste contributes to the solder joint. Accordingly, the invention is also suitable for use with a reflow soldering process.

In one arrangement, close tolerances exist between the pin and the via. This allows the pin to be sized relatively large for improved reliability and performance, and facilitates pin registration and solder retention within the via cavity during the soldering process.

The features of the invention, as described above, may be employed in computer-related systems, devices and manufacturing procedures such as those of EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for forming a connection between a pin and a circuit board using a pin having protruding portions and grooved surfaces that extend between the protruding portions. The protruding portions (i)

prevent the pin from inadvertently slipping through a via of the circuit board, and (ii) maintain the pin's proper position relative to the circuit board via. The grooved surfaces enable gas to vent from a cavity in the via during the solder process thus enabling solder to flow within the via and form a reliable and robust solder joint between the pin and the circuit board via. In one arrangement, the protruding portions and grooved surfaces are at both ends of the pin enabling the pin to be properly soldered between two circuit board sections. Accordingly, the invention is suitable for use in connecting multiple circuit board sections together at opposite ends of the pin. The features of the invention may be employed in computer-related apparatus and manufacturing methods such as those of EMC Corporation of Hopkinton, Mass.

Figure 1:
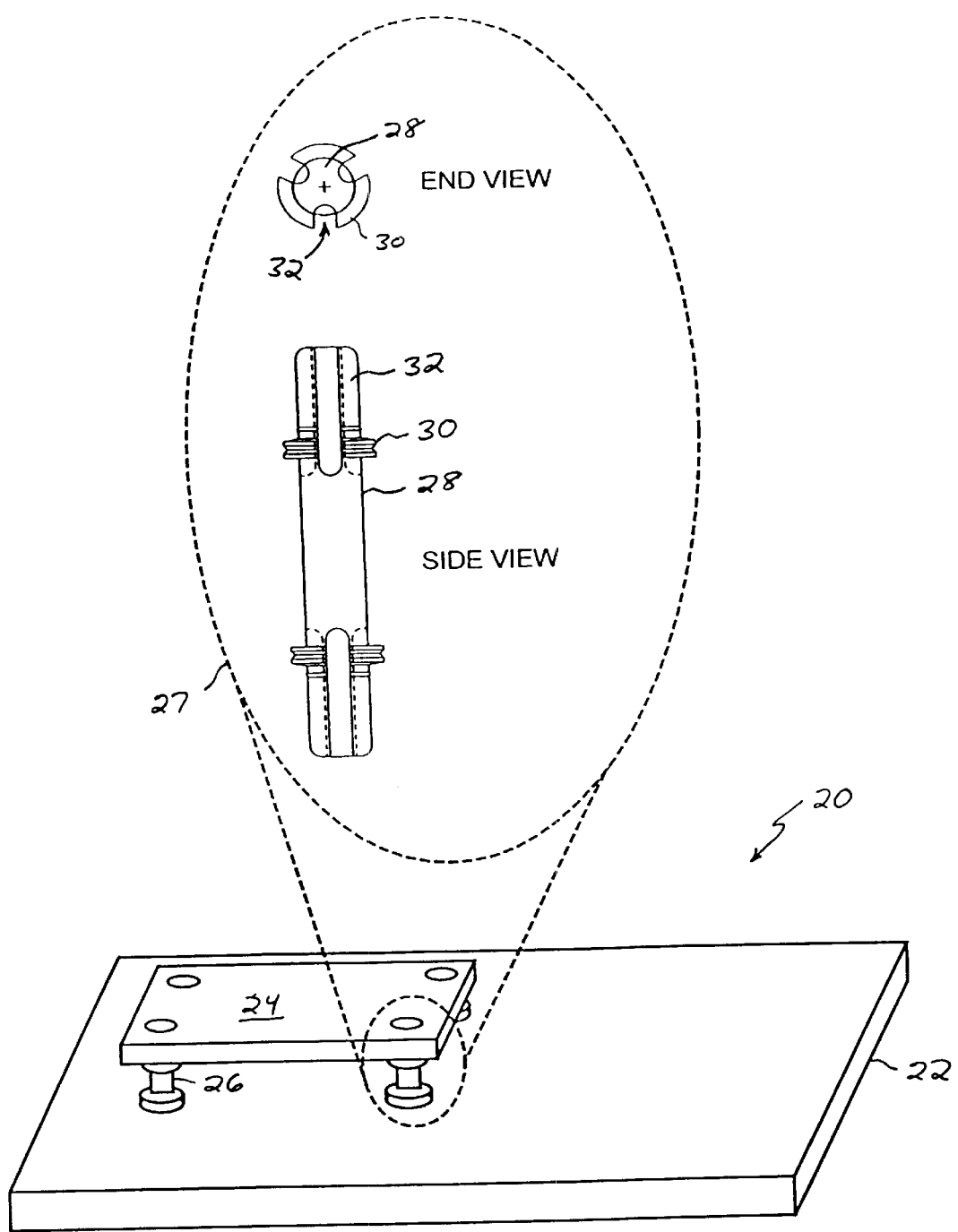
FIG. 1 is a perspective view of a circuit board which is suitable for use by the invention.

FIG. 1 shows a circuit board 20 which is suitable for use by the invention. The circuit board 20 includes two circuit board sections 22, 24 connected by soldered pins 26. Each circuit board section 22, 24 includes layers of conductive material (e.g., metallic etch) and non-conductive material (e.g., fiberglass). By way of example only, the circuit board section 22 is a larger, main circuit board section and can be considered to be a circuit board by itself.

FIG. 1 includes a close-up view 27 of one of the pins 26. This close-up view 27 includes a side view and an end view (e.g., a top view) of that pin 26. As shown, the pin 26 includes an elongated portion 28 and protruding portions 30. The elongate portion 28 has grooved surfaces 32 that extend toward each end of the pin 26 and between pairs of the protruding portions 30.

By way of example only, the circuit board section 24 includes DC-to-DC rectifier circuitry for the main circuit board section 22. In this example, the pins are relatively large diameter pins (e.g., 0.076 inches in diameter) in order to carry high amounts of current (e.g., 30 amps). Preferably, the circuit board vias that receive these pins 26 have diameters which are not twice the pin diameters (as typically occurs in conventional circuit boards), but are relatively close in dimension (e.g., 0.084 inches). Accordingly, there is relatively little space for forming solder joints between the pins 26 and the sides of the vias (e.g., 0.004 inches around each pin 26, or a 0.006 to 0.008 inch clearance, etc.). Further details of the pin 26 will now be provided with reference to FIGS. 2A and 2B.

Figure 2B:
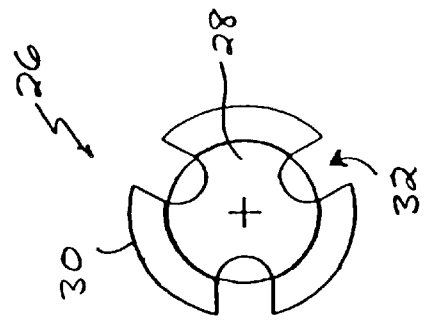
FIG. 2B is an end view of the grooved pin of FIG. 2A.
Figure 2A:
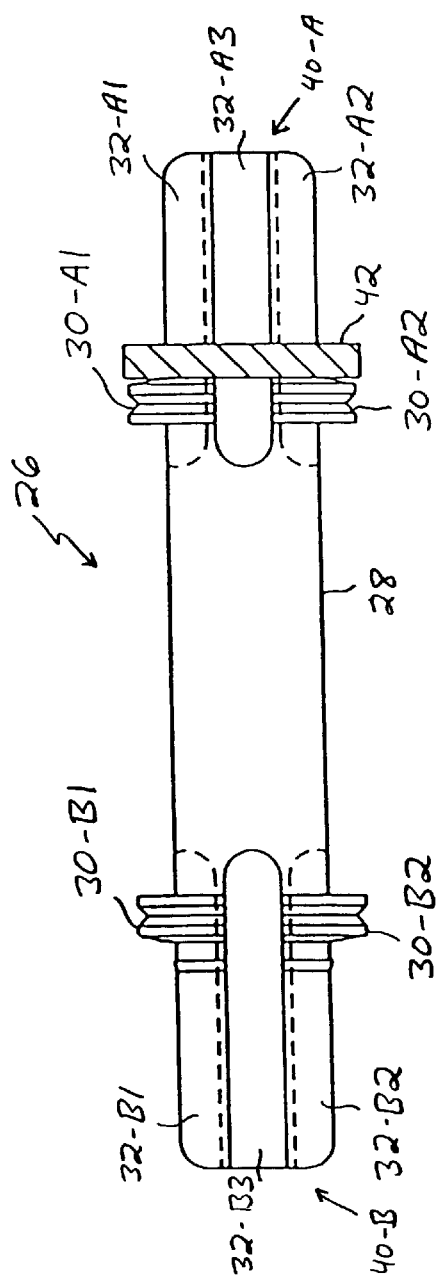
FIG. 2A is a side view of a grooved pin having three grooved surfaces on an end which is suitable for use with the circuit board of FIG. 1.

FIG. 2A shows a detailed side view of the pin 26. As shown, a first set of protruding portions 30-A1, 30-A2, . . . (collectively, protruding portions 30-A) reside toward an end 40-A of the pin 26. Similarly, a second set of protruding portions 30-B1, 30-B2, . . . (collectively, protruding portions 30-B) reside toward another end 40-B of the pin 26.

Additionally, as shown in FIG. 2A, a first set of grooved surfaces 32-A1, 32-A2, . . . (collectively, grooved surfaces 32-A) extend to the end 40-A of the pin 26. In a similar manner, a second set of grooved surfaces 32-B1, 32-B2, . . . (collectively, grooved surfaces 32-B) extend to the other end 40-B. It should be understood that the grooved surfaces 32 extend between pairs of the protruding portions 32. As such, when a pin 26 is inserted within a via for soldering, the grooved surfaces between the protruding portions provide openings that allow gas to escape from the via cavity. Without such openings, the gas could become trapped within the via cavity and prevent solder from filling the spaces between the pin 26 and the via surface. This aspect will be more fully described later below.

It should be understood that the openings between the protruding portions 32 provide enhanced surface area for the solder to bond the pin 26 to the via. This increase in surface area enables the bond between the pin 26 and the via to be mechanically stronger than many conventional solder joint bonds.

Furthermore, it should be understood that the openings between the protruding portions 32 provide convenient visual inspection points for an inspector to visually confirm adequate transfer of solder to the via cavity. That is, an inspector can look though the openings to verify that solder has properly entered the via cavity to form a healthy solder joint.

Additionally, it should be understood that the pin 26 is suitable for a variety of soldering processes (e.g., wave soldering, reflow soldering, intrusive reflow soldering, etc.). In one arrangement, the pin 26 is prepared with a solder preform 42 (e.g., in the shape of a disk), as shown in FIG. 2A, for a reflow soldering process. The preform 42 extends around the elongated portion 28 and sits adjacent the protruding portions 30-A. When a circuit board manufacturer inserts the pin end 40-A into a circuit board via and applies heat to melt the preform 42, solder from the preform 42 flows into the via cavity to form a solder joint between the pin end 40-A and the via. Accordingly, the pin 26 having this optional solder preform 42 is well suited for a reflow soldering process. Other solder enhancements can be made to the pin 26 as well (e.g., plating the pin 26 with solder prior to the soldering process). Further details of the pin 26 will now be provided with reference to FIG. 2B.

FIG. 2B shows an end view of the pin 26 (e.g., an end-on view of the pin 26 from the end 40-A). As clearly shown by FIG. 2B, the pin 26 includes three protruding portions 30 and three grooved surfaces 32 at each end. The number of grooved surfaces 32 and protruding portions 30 (three) is provided by way of example only. In one arrangement, each set of protruding portions 30 provides an interference fit against the end of a circuit board via to prevent the pin 26 from being inserted too deeply within the via. The grooved surfaces 32, which extend between the protruding portions 30, enable gas to escape thus allowing solder to fill the cavity of the via. Further details of the invention will now be described with reference to FIG. 3.

Figure 3:
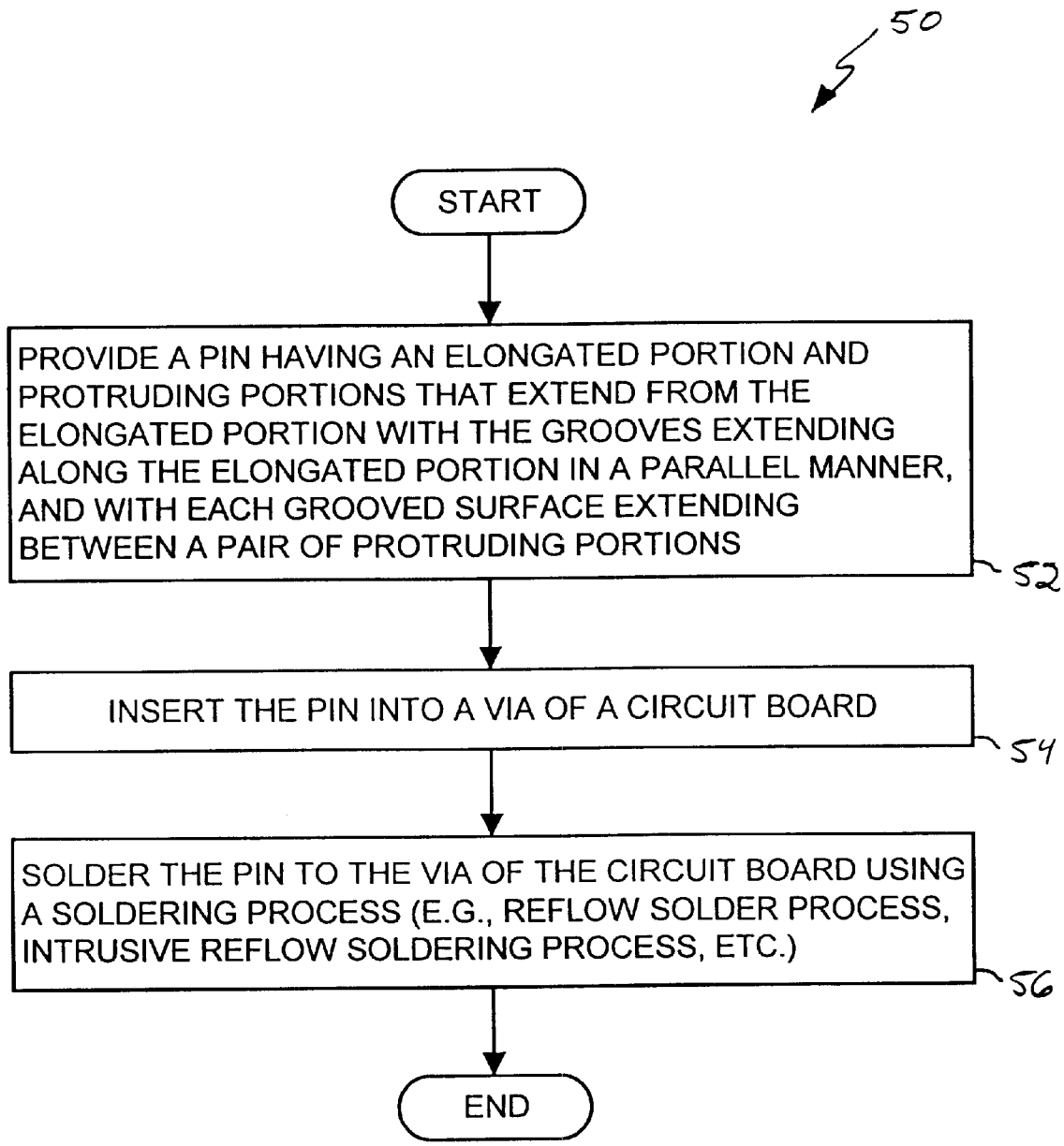
FIG. 3 a flow diagram of a procedure for forming a connection between the pin of FIGS. 2A and 2B and a portion of the circuit board of FIG. 1.

FIG. 3 shows a procedure 50 performed by a circuit board manufacturer for forming a connection between the pin 26 (see FIG. 2) and a circuit board. In step 52, the circuit board manufacturer provides the pin 26 having (i) the elongated portion 28 and (ii) the protruding portions 30 with grooved surfaces 32 extending along the elongated portion 28 in a parallel manner and between pairs of the protruding members 30 (e.g., grooved surface 32-B3 extends between protruding members 30-B1 and 30-B2).

In step 54, the circuit board manufacturer inserts an end of the pin 26 (e.g., pin end 40-B) into a via of the circuit board. The protruding portions 30 of the pin 26 are wider than the diameter of the via cavity in order to provide an interference fit. Accordingly, the pin 26 is prevented from being inserted too deeply into the via.

In step 56, the circuit board manufacturer solders the pin 26 to the via of the circuit board using a soldering process such as wave soldering, reflow soldering or intrusive reflow soldering. During this step, flux on the metallic surfaces of the pin 26 and the via (e.g., from injected solder paste in an intrusive reflow process) volatizes and activates thus increasing the surfaces' affinity for solder. Solder then enters the via cavity and displaces the gas within the cavity. The gas vents out of the cavity through the openings defined by the grooved surfaces 32 between the protruding portions 30.

The end result is a strong, robust and reliable solder joint between the pin 26 and the circuit board via.

Additional details of the invention will be understood with reference to the following example. Suppose that the circuit board manufacturer is manufacturing the circuit board 20 of FIG. 1 using the main circuit board section 22, the circuit board section 24 (a DC-to-DC rectifier circuit), and the pins 26 (large diameter power supply pins). By way of example only, the manufacturer solders multiple pins 26 to both circuit board sections 22, 24 simultaneously (i.e., in a single soldering operation). First, the manufacturer obtains the circuit board sections 22, 24 and the pins 26 (step 52 of the procedure 50, see FIG. 3).

Next, the manufacturer then places the ends 40-A of four pins 26 having the preform 42 into the vias of the main circuit board section 22, and positions the circuit board section 24 on top of the pins 26 such that the other ends 40-B of the pins 26 insert into vias of the circuit board section 24 (step 54). The preforms 42 and the protruding portions 30-A prevent the pins 26 from inserting too deeply within the vias of the circuit board section 22. Similarly, the protruding portions 30-B support and separate the circuit board section 22 from the circuit board section 22, and prevent the pins 26 from slipping deeply into the vias of the circuit board section 24. The manufacturer deposits solder paste on the ends 40-B of the pins 26 which stick out of the circuit board sections 24 (e.g., prints solder paste through a stencil, ejects solder paste from a syringe-like device, etc.).

Then, the manufacturer applies heat to solder the pins 26 to the circuit board sections 22, 24 to solder the pins 26 simultaneously to the circuit board sections 22, 24 (step 56). The preforms 42 of the pins 26 reflow thus forming solder joints between the pin ends 40-A and the circuit board section 22 (reflow soldering), and the solder paste activates and melts thus forming solder joints between the pin ends 40-B and the circuit board section 24 (intrusive reflow soldering). The end result is a set of healthy solder joints between the pins 26 and the circuit board sections 22, 24.

It should be understood that, in the above-described example, the pins 26 and the circuit board sections 22, 24 are self-registering during the soldering process. In particular, as the preforms 42 melt, the pins 26 drop further into the vias of the main circuit board section 22. The protruding portions 30-A control the positioning of the pins 26 within the via cavities and prevent the pins 26 from dropping too deeply. Gas from the via cavities of the circuit board section 22 percolate out of the openings defined by the grooved surfaces 32-A extending between the protruding portions 30-A to the end 40-A. Similarly, the openings defined by the grooved surfaces 32-B, which extend between the protruding portions 32-B to the end 40-B, allow solder to flow into and gas to percolate out of the via cavities of the circuit board section 24.

As described above, the pins 26 are capable of self-locating or registering themselves within the circuit board vias without the need for any pin-carrying or pin-holding device. Nevertheless, a pin-holding device can be used to guarantee correct positioning of the pins relative to the circuit board sections 22, 24.

It should be further understood that, in the DC-to-DC rectifier example described above which uses large diameter pins 26 as power supply pins, the tolerances between the pins 26 and the inner surfaces of the circuit board vias are preferably close (e.g., 0.076 inch diameter pins 26 in 0.084 inch diameter via cavities). The close tolerances provide relatively high surface area which is sufficient to retain the solder within the via cavities thus preventing solder from escaping the via cavities of the device 24. In particular, the surface tension of the solder that adheres to the surfaces makes it unlikely that the solder sags or leaks out. Additionally, the openings defined by the grooved surfaces 32 between the protruding portions 32 facilitate gas venting from the remaining spaces between the pins 26 and the vias. Without such openings it is likely that the gas would remain trapped and prevent solder from filling the via cavities to form healthy solder joints. In view of the relatively high surface areas and openings for solder flow into the via cavities (drawn by the solder's high affinity for the metallic surfaces of the pins and the vias) and gas percolation out of the via cavities, the above-described configuration is well suited for reflow soldering and intrusive reflow soldering processes, and there is little risk of forming weakened and unreliable solder joints due to lost solder. Further details of the invention will now be provided with reference to FIGS. 4A and 4B.

Figures 4A, 4B:
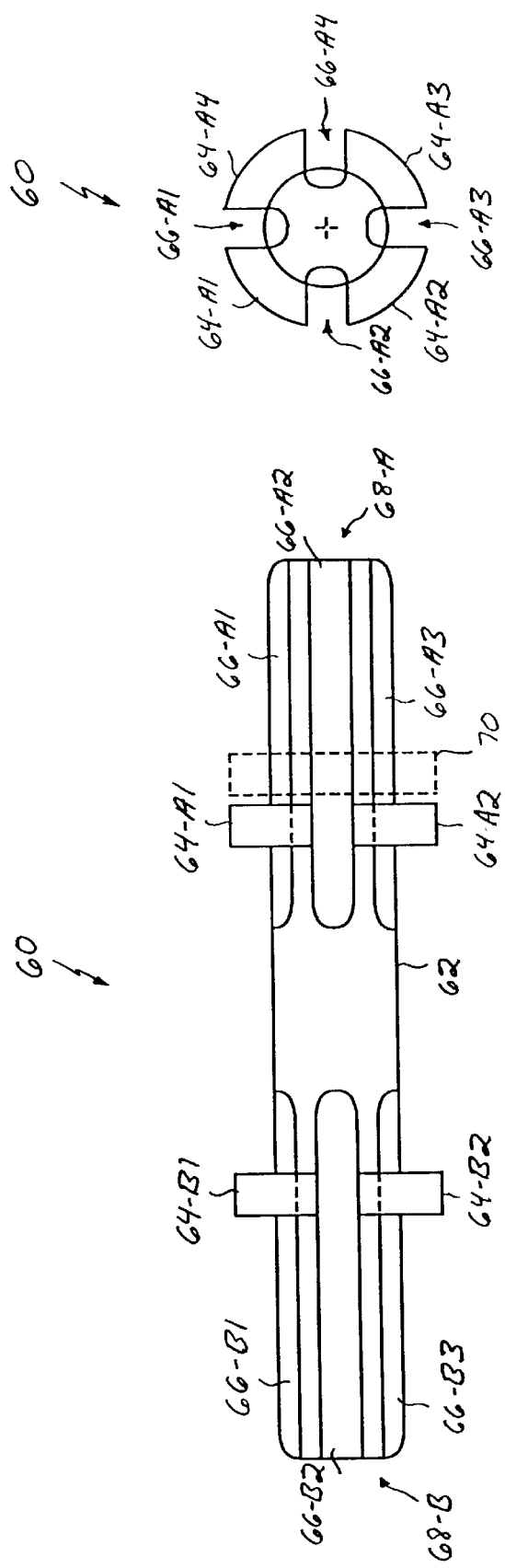
FIG. 4A is a side view of an alternative grooved pin having four grooved surfaces on an end which is suitable for use with the circuit board of FIG. 1.
FIG. 4B is an end view of the grooved pin of FIG. 4A.

FIG. 4A shows a side view of an alternative pin 60 which is suitable for use in the circuit board 20 of FIG. 1 in place of the pins 26. The pin 60 is similar to the pin 26 in that the pin 60 includes an elongated portion 62 and protruding portions 64. The elongated portion 62 has grooved surfaces 66 that extend between the pairs of the protruding portions 64. In particular, a first set of grooved surfaces 66-A extend between pairs of a first set of protruding portions 64-A to one end 68-A of the pin 60, and a second set of grooved surfaces 66-B extend between pairs of a second set of protruding portions 64-B to another end 68-B. In one arrangement, and as shown in FIG. 4A, the pin 60 includes a solder preform 70 making the pin 60 suitable for use in a reflow soldering process.

FIG. 4B shows an end view of the alternative pin 60. In contrast to the pin 26 (see FIG. 2B), the pin 60 has four grooved surfaces 66 and four protruding portions 64 at each end 68. However, in a manner similar to that of the pin 26, the grooved surfaces 66 and protruding portions 64 of the pin 60 provide adequate surface area for solder wetting as well as adequate openings for gas venting and/or solder flow into via cavities during the soldering process. Other grooved surface configurations are suitable for the invention as well.

Figure 5:
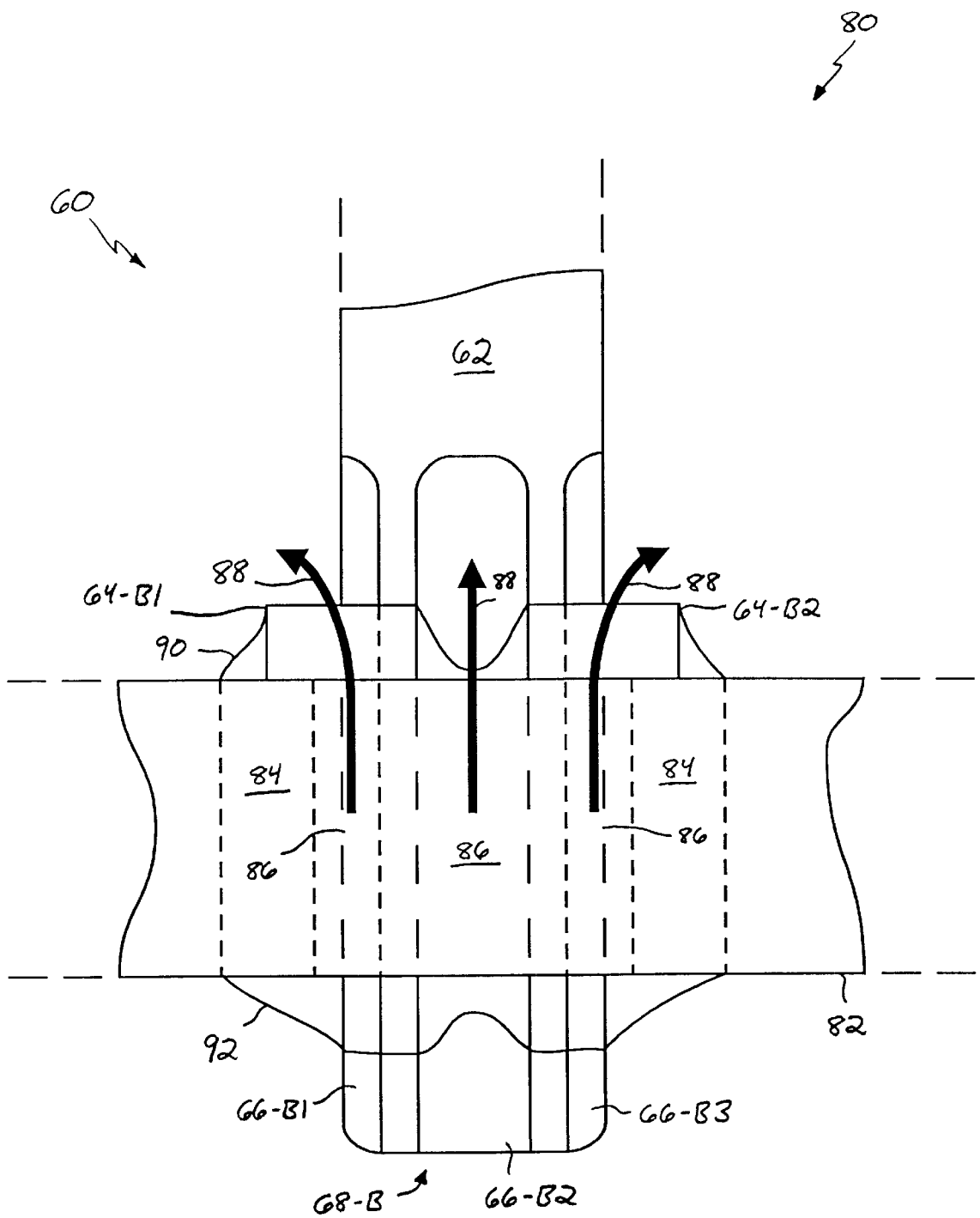
FIG. 5 is a cross-sectional view of a circuit board that uses a grooved pin similar to that of FIGS. 2A and 2B.

FIG. 5 shows a detailed view of a connection 80 between the pin 60 and a circuit board section 82 (or circuit board). The circuit board section 82 includes a via 84. Sides of the via 82 are shown as dashed lines. One end 68-B of the pin 60 inserts through a cavity 86 of the via 84. The protruding portions 64-B of the pin 60 form an interference fit against an end of the via 84 thus preventing further insertion of the pin 60 through the via 84.

During the soldering process, the grooved surfaces 64-B allow gas 88 within the cavity 86 to escape, and solder to draw (i.e., "wick up") into the via cavity 86. As solder is drawn into the via cavity 86, some solder may adhere to the metallic outer surfaces of the various components of the connection 80 to form fillets 90, 92 (due to the solder's affinity for metallic surfaces). In particular, fillets 90 may form between the protruding portions 64-B and the ends of the via 84, and fillets 92 may form between the end 68-B of the elongated portion 62 of the pin 60 and the other end of the via 84. Such fillets 90, 92 are indicative of a robust and reliable solder joint. Further details of the invention will now be described with reference to FIG. 6.

Figure 6:
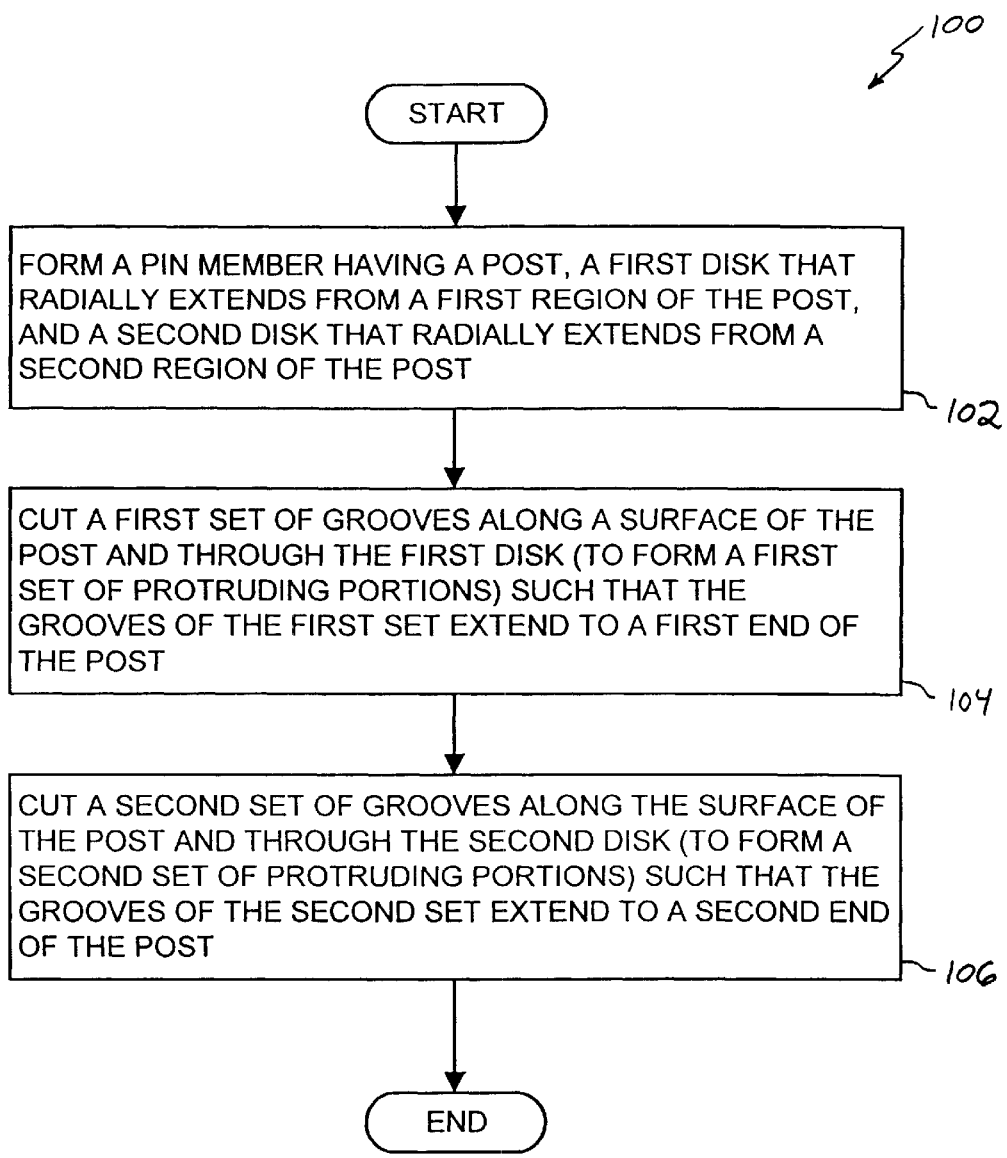
FIG. 6 is a flow diagram of a procedure for generating the grooved pin of FIGS. 2A and 2B.

FIG. 6 shows a procedure for providing, e.g., by a pin or circuit board manufacturer, the pins 26, 60. In step 102, the manufacturer forms a solid pin member having a post, a first disk that radially extends from a first region of the post, and a second disk that radially extends from a second region of the post. In one arrangement, the post and the disks are solid and rigidly contiguous with each other.

In step 104, the manufacturer cuts a first set of grooves along a surface of the post and through the first disk to form a first set of protruding portions (e.g., see protruding portions 30-A of FIGS. 2A and 2B, and protruding portions 64-A of FIGS. 4A and 4B). The grooves preferably are cut such that the grooves extend to a first end of the post (e.g., see end 40-A of FIG. 2A, and end 68-A of FIG. 4A). In one arrangement, the grooved surfaces are rounded in shape as shown by the end views of FIGS. 2B and 4B. Such a rounded shape is conducive for healthy solder flow and solder adherence to the sides of the pin.

In step 106, the manufacturer cuts a second set of grooves along the surface of the post and through the second disk to form a second set of protruding portions (e.g., see protruding portions 30-B of FIGS. 2A and 2B, and protruding portions 64-B of FIGS. 4A and 4B). Preferably, the grooves are cut such that the grooves extend to a second end of the post (e.g., see end 40-B of FIG. 2A, and end 68-B of FIG. 4A).

As described above, the invention is directed to techniques for forming a connection between a pin (e.g., pins 26, 60) and a circuit board section (e.g., sections 22, 82) using a pin having protruding portions and grooved surfaces that extend between the protruding portions. These grooved surfaces define openings between the protruding portions that enable gas venting from a via of the circuit board during the solder process thus enabling solder to flow within the via and form a robust and reliable solder joint between the pin and the circuit board via. In some applications, the pins can be soldered to multiple circuit board sections simultaneously. The presence of the grooved surfaces and protruding portions provide large surface areas for retaining melted solder within via cavities and generally prevents melted solder from escaping the via cavities. The features of the invention may be employed in computer-related device and manufacturing procedures such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the pin 26 was described as being soldered to two circuit board sections 22, 24 by way of example only. There is no requirement that the pin 26 be used in such a situation. Rather, the pin 26 can be used in other situations. In other arrangements, the pin 26 is soldered at only one end (e.g., soldered to a circuit board section at one end while affixed to a component package in a conventional manner at the other end). In arrangements in which the pin is soldered at only one end, the pin can have the grooved surfaces and protruding portions only at the end that is soldered.

Additionally, it should be understood that the pins were described and shown as having rounded grooved surfaces by way of example only. The pins can have other shaped grooved surfaces. In one arrangement, the pins have V-shaped grooved surfaces which can be less expensive to form in the pins (e.g., routed V-shaped grooved surfaces). The rounded grooved surfaces tend to receive solder better than V-shaped grooved surfaces, and the V-shaped grooved surfaces can, in some instances, trap gas or other impurities deep in the notches of the V-shaped grooves.

Furthermore, it should be understood that the pins 26, 60 were described above as having close tolerances with the vias by way of example only. This is not a requirement and the vias can be sized relatively larger. The close tolerances tend to hold solder better and, with the openings defined by the grooved surfaces between the protruding portions, solder easily flows into and gas easily percolates from the remaining areas of the via cavities. Such close tolerance configurations are well suited for a variety of solder processes and technologies (e.g., wave soldering, reflow soldering, intrusive reflow soldering, etc.).

Additionally, it should be understood that the pins 26, 60 were described as having three and four grooves on each end, respectively, by way of example only. Other numbers of grooves are suitable for use by the invention as well. Also, there is no requirement that the end of each pin have the same number of grooves.

Also, it should be understood that the pins 26, 60 were described above as being large diameter power supply pins by way of example only. In other arrangements, the pins 26, 60 have more traditional diameters (e.g., 0.018 inches). In these arrangements, the vias can have close tolerances (e.g., 0.006 to 0.008 inch clearances), or larger clearances (e.g., 0.018 inch clearances). In one arrangement, the pin is made as large as possible/practical for enhanced reliability purposes, the clearance is close (e.g., 0.006 to 0.008 inches), and an intrusive reflow soldering process is used.

Furthermore, it should be understood that the grooved surfaces where described as extending to the ends of the pins 26, 60 by way of example only. In another arrangement, the grooved surfaces do not extend all the way to the ends of the pins, but extend at least between the protruding portions in order to facilitate gas venting between the protruding portions. Extending the grooved surfaces to the ends of the pins tends to be less costly in some situations.

Additionally, it should be understood that some of the steps in the above-described procedures can be performed concurrently rather than serially. For example, the cutting steps 104, 106 can be performed concurrently (e.g., a router can cut both ends of a pin, the pin can be rotated, and the router can cut again).

Furthermore, it should be understood that the pins can form solder joints between multiple circuit board sections using soldering processes performed at different times (i.e., in more than one soldering operation). For example, the pins 26 can be soldered to the smaller circuit board section 24 first. The pins 26 (and the attached circuit board section 24) can then be soldered to the main circuit board section 22. A variety of technologies can be implemented to deter the solder joints between the pins 26 and the circuit board section 24 from reflowing. For example, the solder joints between the pins 26 and the circuit board section 24 can use higher temperature solder than the solder used to form solder joints between the pins 26 and the main circuit board section 22. As another example, the solder joints between the pins 26 and the circuit board section 24 can be cooled during formation of the solder joints between the pins 26 and the main circuit board section 22. Such modifications and enhancements are intended to be within the scope of the invention.

What is claimed is:

1. A circuit board, comprising:
   a section of circuit board material having a via;
   a pin that includes (i) an elongated portion having grooved surfaces that extend along the elongated portion in a parallel manner, and (ii) protruding portions that extend from the elongate portion, wherein each grooved surface of the elongated portion extends between a pair of the protruding portions; and solder that connects the pin to the via of the section of circuit board material.

2. The circuit board of claim 1 wherein the elongated portion of the pin includes a first end and a second end, and wherein the grooved surfaces of the elongated portion extend to the first end of the elongated portion.

3. The circuit board of claim 1 wherein the solder contacts a surface of the via and the grooved surfaces of the elongated portion of the pin.

4. The circuit board of claim 1 wherein the elongated portion of the pin includes at least three grooved surfaces.

5. The circuit board of claim 1 wherein the elongated portion of the pin has a circular cross-section, wherein a first set of the protruding portions extends from a first circular cross-sectional region of the elongated portion, and wherein a second set of the protruding portions extends from a second circular cross-sectional region of the elongated portion.

6. The circuit board of claim 1 wherein the elongated portion of the pin has a first end and a second end, and wherein a first set of the grooved surfaces of the elongated portion extend to the first end of the elongate portion, and wherein a second set of the grooved surfaces of the elongated portion extend to the second end of the elongated portion.

7. The circuit board of claim 1 wherein the solder is a solder joint formed by an reflow soldering process.

8. The circuit board of claim 1 wherein the solder is a solder joint formed by an intrusive reflow soldering process.

9. The circuit board of claim 1 wherein the protruding portions have a thickness, and wherein each of the grooved surfaces has a length that is greater than the thickness of the protruding portions.

10. The circuit board of claim 1 wherein the grooved surfaces of the elongated portion of the pin are concave toward an interior of the pin.

11. The circuit board of claim 1 wherein the elongated portion of the pin has the narrowest cross-sectional diameter of the pin.

12. The circuit board of claim 1 wherein an end of the elongated portion has a substantially flat surface.

13. A pin for connecting to a circuit board, comprising:

an elongated portion having grooved surfaces that extend along the elongated portion in a parallel manner; and protruding portions that extend from the elongate portion, wherein each grooved surface of the elongated portion extends between a pair of the protruding portions.

14. The pin of claim 13 wherein the elongated portion includes a first end and a second end, and wherein the grooved surfaces of the elongated portion extend to the first end.

15. The pin of claim 13 wherein the elongated portion has a circular cross-section, wherein a first set of the protruding portions extends from a first circular cross-sectional region of the elongated portion, and wherein a second set of the protruding portions extends from a second circular cross-sectional region of the elongated portion.

16. The pin of claim 13 wherein the elongated portion of the pin includes at least three grooved surfaces.

17. The pin of claim 13 wherein the elongated portion has a first end and a second end, and wherein a first set of the grooved surfaces of the elongated portion extend to the first end, and wherein a second set of the grooved surfaces of the elongated portion extend to the second end.

18. The pin of claim 13 wherein the protruding portions have a thickness, and wherein each of the grooved surfaces has a length that is greater than the thickness of the protruding portions.

19. The pin of claim 13 wherein the grooved surfaces of the elongated portion of the pin are concave toward an interior of the pin.

20. The pin of claim 13 wherein the elongated portion of the pin has the narrowest cross-sectional diameter of the pin.

21. The pin of claim 13 wherein an end of the elongated portion has a substantially flat surface.

22. A pin for connecting to a circuit board, comprising:

an elongated portion having grooved surfaces that extend along the elongated portion in a parallel manner; and means for simultaneously supporting the pin relative to the circuit board and ventilating gas from a via in the circuit board in a direction that is substantially parallel to the elongated portion of the pin.

* * * * *